United States Patent
Chen et al.

(10) Patent No.: US 9,499,920 B2
(45) Date of Patent: Nov. 22, 2016

(54) METHODS FOR PRODUCING RECTANGULAR SEEDS FOR INGOT GROWTH

(71) Applicant: MEMC Singapore Pte. Ltd. (UEN200614794D), Singapore (SG)

(72) Inventors: Jihong John Chen, St. Charles, MO (US); Susan S. Dwyer, Collinsville, IL (US); Shawn Wesley Hayes, Foristell, MO (US); Thomas E. Doane, Troy, MO (US); Dale A. Witte, Wentzville, MO (US); Linda K. Swiney, St. Charles, MO (US); Travis L. Hambach, Warrenton, MO (US)

(73) Assignee: MEMC Singapore Pte. Ltd. (UEN200614794D), Singapore (SG)

( * ) Notice: Subject to any disclaimer, the term of this patent is extended or adjusted under 35 U.S.C. 154(b) by 0 days.

(21) Appl. No.: 14/795,522

(22) Filed: Jul. 9, 2015

(65) Prior Publication Data
US 2015/0308011 A1   Oct. 29, 2015

Related U.S. Application Data

(62) Division of application No. 13/731,528, filed on Dec. 31, 2012, now Pat. No. 9,111,745.

(51) Int. Cl.
*C30B 11/14* (2006.01)
*C30B 33/06* (2006.01)
(Continued)

(52) U.S. Cl.
CPC .............. *C30B 11/14* (2013.01); *B28D 5/045* (2013.01); *C30B 29/06* (2013.01); *C30B 33/06* (2013.01); *H01L 21/02* (2013.01); *H01L 21/02005* (2013.01); *Y10T 156/1052* (2015.01)

(58) Field of Classification Search
CPC ....... C30B 33/06; C30B 11/04; C30B 29/06; B28D 5/045; H01L 21/02; Y10T 156/1052
See application file for complete search history.

(56) References Cited

U.S. PATENT DOCUMENTS

| 3,809,050 A | 5/1974 | Chough et al. |
| 7,045,093 B2 | 5/2006 | Tanaka et al. |

(Continued)

FOREIGN PATENT DOCUMENTS

| DE | 19739966 A1 | 3/1999 |
| JP | 2003095790 A | 4/2003 |

(Continued)

OTHER PUBLICATIONS

Applied HCT Wafering Systems, Brochure, Oct. 2012, pp. 9; Applied Materials, Inc.

(Continued)

*Primary Examiner* — Linda L Gray
(74) *Attorney, Agent, or Firm* — Armstrong Teasdale LLP

(57) ABSTRACT

A method of producing rectangular seeds for use in semiconductor or solar material manufacturing includes connecting an adhesive layer to a top surface of a template, the template including a plurality of parallel slots, and drawing alignment lines on the adhesive layer, the alignment lines aligned with at least some of the parallel slots. The method also includes connecting quarter sections to the adhesive layer such that an interface between a rectangular seed portion and a curved wing portion of each quarter section is aligned with at least one of the alignment lines drawn on the adhesive layer, and slicing each of the quarter sections to separate the rectangular seed portions from the curved wing portions.

8 Claims, 15 Drawing Sheets

(51) Int. Cl.
*C30B 29/06* (2006.01)
*H01L 21/02* (2006.01)
*B28D 5/04* (2006.01)

(56) References Cited

U.S. PATENT DOCUMENTS

| | | |
|---|---|---|
| 7,591,712 B2 | 9/2009 | Morikawa et al. |
| 7,993,453 B2 | 8/2011 | Oyanagi et al. |
| 2007/0131213 A1 | 6/2007 | Matsuda |
| 2007/0169685 A1 | 7/2007 | Stoddard |
| 2008/0182092 A1 | 7/2008 | Bondokov et al. |
| 2010/0051009 A1 | 3/2010 | Modler et al. |
| 2012/0085332 A1 | 4/2012 | Kimbel |
| 2012/0272944 A1 | 11/2012 | Coustier et al. |

FOREIGN PATENT DOCUMENTS

| | | |
|---|---|---|
| JP | 2004292286 A | 10/2004 |
| KR | 20090081360 A | 7/2009 |
| KR | 2010093892 A | 8/2010 |
| WO | 2008015895 A1 | 2/2008 |
| WO | 2009040109 A1 | 4/2009 |
| WO | 2010078205 A1 | 7/2010 |
| WO | 2011002242 A2 | 1/2011 |
| WO | 2011032599 A1 | 3/2011 |

OTHER PUBLICATIONS

Wafer Slicing Technology for Solar Photovoltaic Cells, Brochure, Apr. 2011, pp. 6, Applied Materials, Inc.
Advanced Wire Sawing Technology for Solar Photovoltaic Cells, Brochure, Apr. 2011, pp. 8, Applied Materials, Inc.
Wafer Wire Sawing Economics and Total Cost of Ownership Optimization, Brochure, Apr. 2011, pp. 10, Applied Materials, Inc.
BrickMaster BM860, Fact Sheet, pp. 2, Meyer Burger AG, www.meyerburger.ch.
International Search Report and Written Opinion of the International Searching Authority regarding PCT/US2013/077230 mailed on May 27, 2014; 12 pgs.
International Search Report and Written Opinion of the International Searching Authority regarding PCT/US2013/077210 mailed on Mar. 19, 2014; 14 pgs.

METHODS FOR PRODUCING RECTANGULAR SEEDS FOR INGOT GROWTH

CROSS-REFERENCE TO RELATED APPLICATION

This application is a divisional of U.S. patent application Ser. No. 13/731,528 filed Dec. 31, 2012, the entire disclosure of which is hereby incorporated by reference.

FIELD

This disclosure generally relates to seeds for use in manufacturing semiconductor or solar wafers, and more specifically, to producing seeds for ingot growth.

BACKGROUND

Silicon seeds are the starting material in many processes for fabricating semiconductor electronic components and solar materials. For example, a silicon seed brick may be split into multiple seeds. To produce semiconductor or solar wafers, and in particular high efficiency solar wafers, a silicon ingot may be produced by melting polycrystalline silicon in a crucible of a directional solidification system (DSS) furnace from the top down to the seeds at the bottom of the crucible. Directional solidification generally maintains the seed crystalline structure throughout the produced ingot. The silicon ingot is then machined into wafers, which can be used in a variety of electronic or solar components.

In some applications, cutting individual seeds from a cylindrical rod may be time-consuming. Further, using a band saw to cut seeds may result in a poor surface finish on the resulting seeds, and may cause irregular and/or misshapen mating surfaces on the resulting seeds.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

One aspect is a method of producing rectangular seeds for use in semiconductor or solar material manufacturing. The method includes connecting an adhesive layer to a top surface of a template, the template including a plurality of parallel slots, and drawing alignment lines on the adhesive layer, the alignment lines aligned with at least some of the parallel slots. The method further includes connecting quarter sections to the adhesive layer such that an interface between a rectangular seed portion and a curved wing portion of each quarter section is aligned with at least one of the alignment lines drawn on the adhesive layer, and slicing each of the quarter sections with a wire web to separate the rectangular seed portions from the curved wing portions, wherein the sliced rectangular seed portions are rectangular seeds.

Another aspect is a method of producing rectangular seeds for use in semiconductor or solar material manufacturing. The method includes connecting an alignment layer to a top surface of a template, the template including a grid of horizontal and vertical slots, drawing alignment lines on the alignment layer to demarcate a plurality of nodes, and connecting cylindrical rods to the alignment layer such that a center of each rod is aligned with a corresponding node. The method further includes slicing through the rods and the alignment layer with a wire web to produce quarter sections each including a rectangular seed portion and a curved wing portion, and slicing each of the quarter sections with the wire web to separate the rectangular seed portions from the curved wing portions, wherein the sliced rectangular seed portions are rectangular seeds.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

Figure 1:
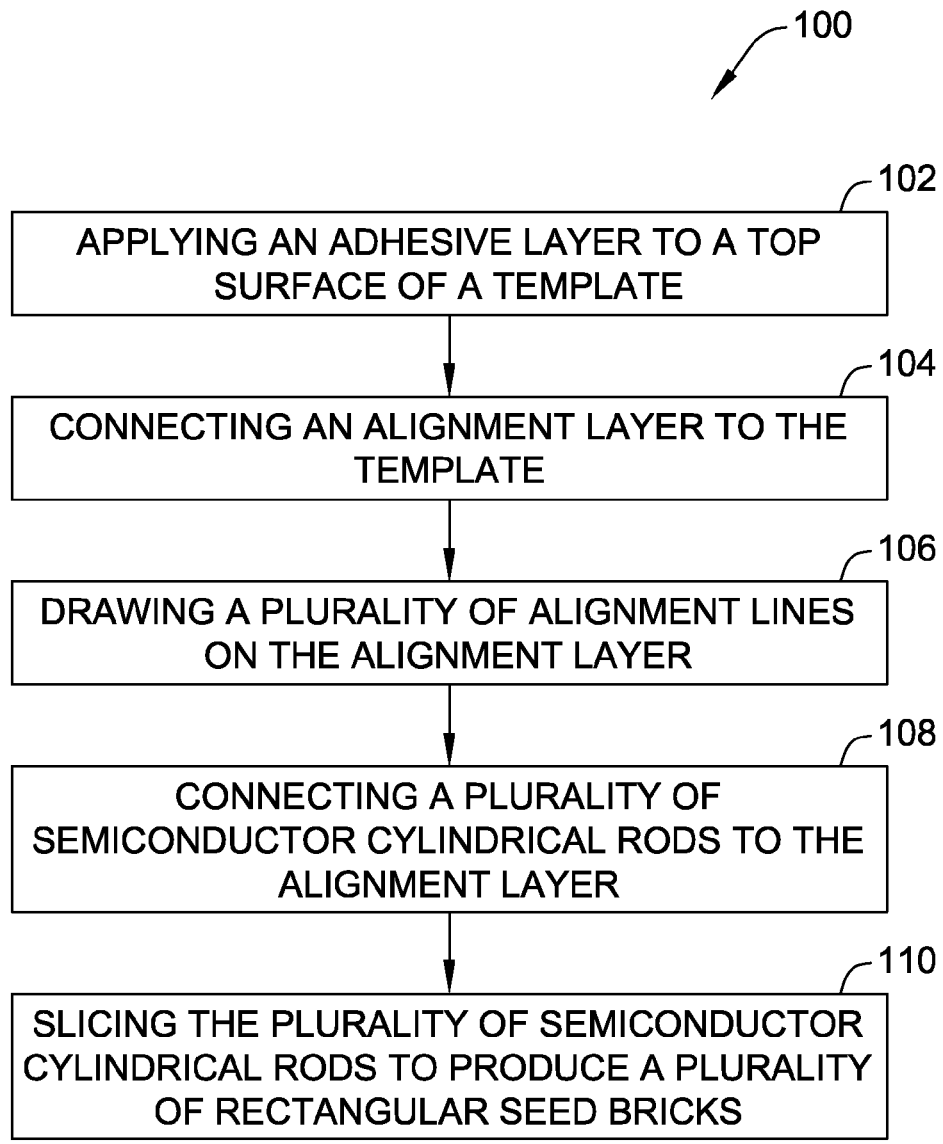
FIG. 1 is a flowchart of a method for use in producing a plurality of seed bricks.

Referring initially to FIG. 1, a method for producing seed bricks is indicated generally at 100. Seed bricks produced using method 100 may be used to produce semiconductor or solar wafers, including high-efficiency solar wafers, as described herein.

The method 100 generally includes a step 102 of applying an adhesive layer to a top surface of a template, a step 104 of connecting an alignment layer to the template, a step 106 of drawing a plurality of alignment lines on the alignment layer, a step 108 of connecting a plurality of cylindrical rods to the alignment layer, and a step 110 of slicing the plurality of cylindrical rods to produce a plurality of rectangular seed bricks.

Figure 2:
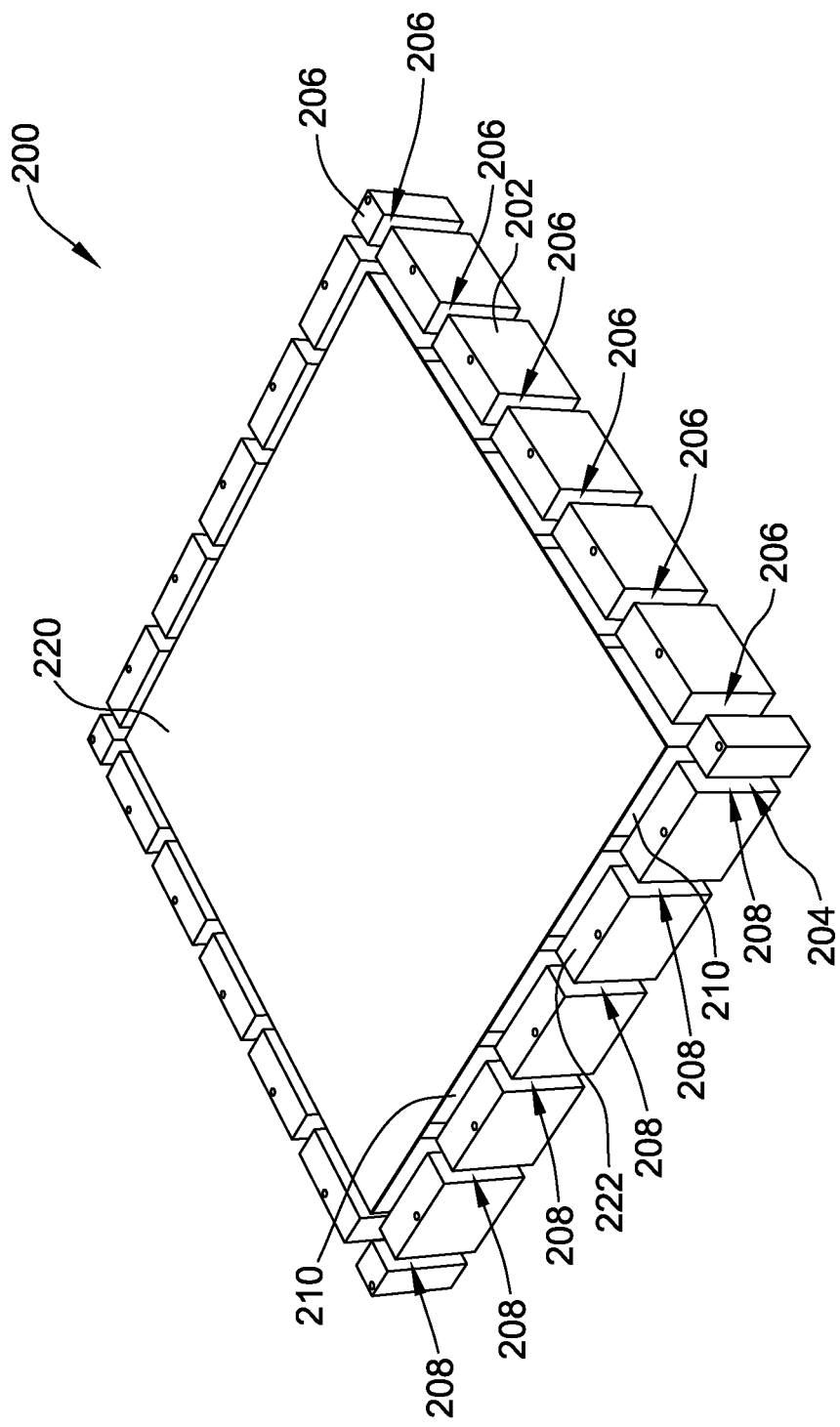
FIG. 2 is a perspective view of an apparatus of one embodiment for producing seed bricks.

Referring to FIGS. 2-8, an apparatus for producing seed bricks is indicated generally at 200. As shown in FIG. 2, apparatus 200 includes a template 202 that includes a plurality of slots 204 defined therethrough. Slots 204 include vertical slots 206 and horizontal slots 208 that are orthogonal to vertical slots 206.

In this embodiment, template 202 includes six vertical slots 206 and six horizontal slots 208 arranged in a grid that subdivides template 202 into twenty-five square-shaped sections 210 of equal size. In this embodiment, each square-shaped section 210 has dimensions of approximately 156 millimeters (mm) by approximately 156 mm. As template 202 includes a 5×5 grid of square-shaped sections 210, template 202 may also be referred to as a G5 template.

In other embodiments, template 202 may include any suitable number of horizontal and vertical slots 206 and 208, so as to divide template 202 into any suitable number of square-shaped sections 210. For example, in some embodiments, template 202 includes nine vertical slots 206 and nine horizontal slots 208 to divide template 202 into sixty four square-shaped sections 210 (i.e., an 8×8 grid).

As shown in FIG. 2, an adhesive layer 220 is applied to a top surface 222 of template 202. In this embodiment, adhesive layer 220 is a layer of double-sided mounting tape that covers the twenty-five square-shaped sections 210. In other embodiments, adhesive layer 220 may be any suitable adhesive and have any suitable dimensions.

Figure 3:
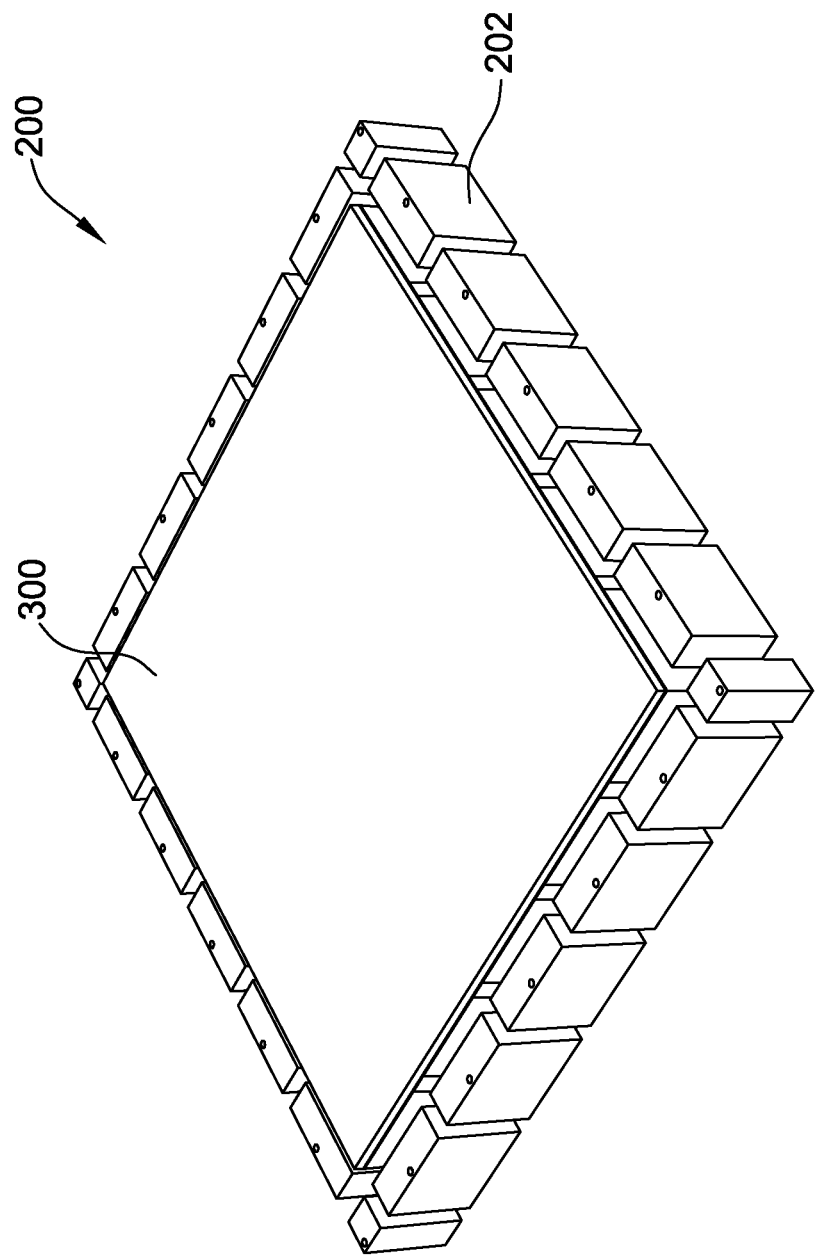
FIG. 3 is a perspective view of the apparatus shown in FIG. 2 including an alignment layer.

Referring back to FIG. 1, an alignment layer is connected in step 104 to the template. FIG. 3 shows an alignment layer 300 connected to template 202. Specifically, adhesive layer 220 facilitates connecting alignment layer 300 to template 202. In this embodiment, similar to adhesive layer 220, alignment layer 300 covers the twenty-five square-shaped sections 210 of template 200.

Referring back to FIG. 1, a plurality of alignment lines are drawn in step 106 on the alignment layer. The alignment lines may suitably be drawn using a suitable writing instrument, such as a pen, pencil, marker, etc., and may be drawn with the aid of a straight edge.

Figure 4:
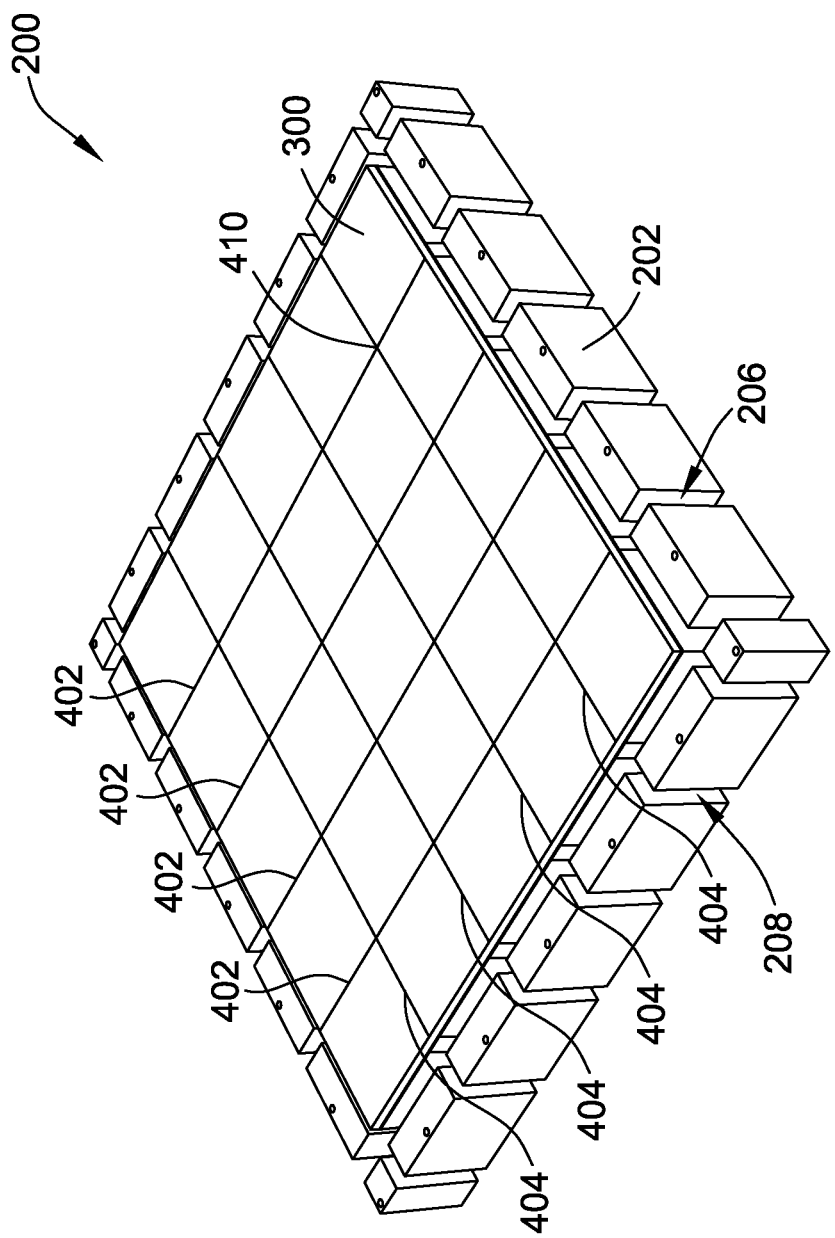
FIG. 4 is a perspective view of the apparatus shown in FIG. 3 including alignment lines drawn on the alignment layer.
Figure 5:
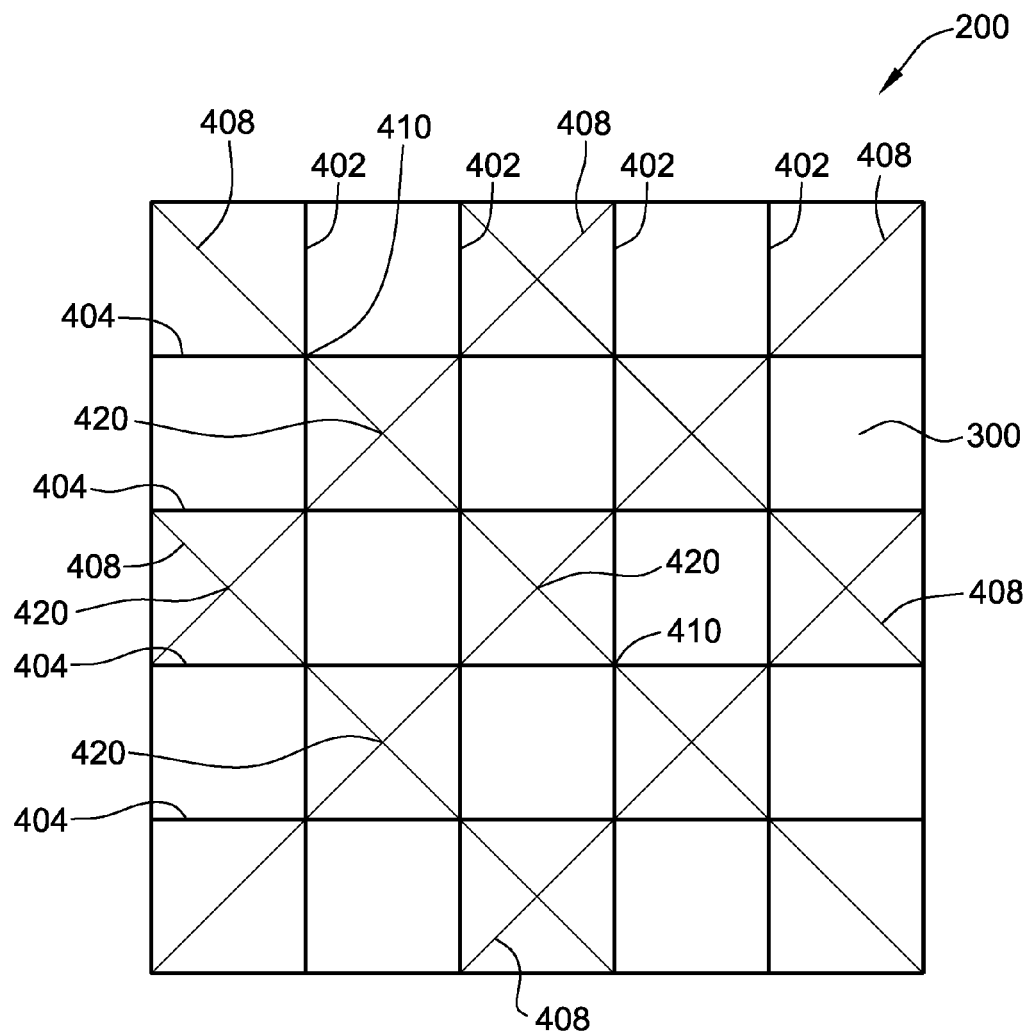
FIG. 5 is a schematic diagram of the apparatus shown in FIG. 4 including diagonal alignment lines.

FIG. 4 shows vertical alignment lines 402 and horizontal alignment lines 404 drawn on alignment layer 300. In this embodiment, alignment layer 300 is a foam layer. In other embodiments, alignment layer 300 may be any suitable material. Vertical and horizontal alignment lines 402 and 404 are substantially aligned with vertical and horizontal slots 206 and 208 of template 202. Once vertical and horizontal alignment lines 402 and 404 are drawn, diagonal alignment lines 408 can be drawn, as shown in FIG. 5. Diagonal alignment lines 408 pass through intersections 410 between vertical and horizontal alignment lines 402 and 404.

An intersection between diagonal alignment lines 408 is referred to as a node 420. In this embodiment, diagonal alignment lines 408 intersect to demarcate a plurality of nodes 420 on alignment layer 300.

Figure 6:
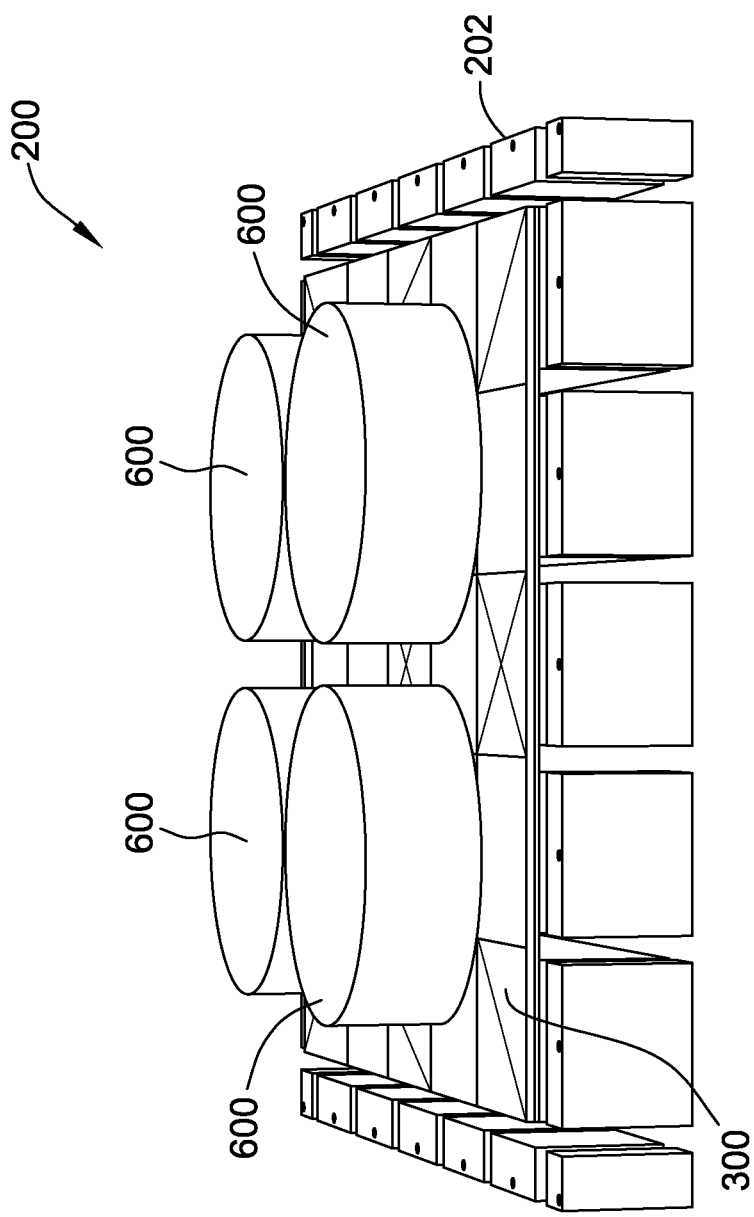
FIG. 6 is a perspective view of the apparatus shown in FIG. 5 including a plurality of cylindrical rods.

Referring back to FIG. 1, cylindrical rods are connected in step 108 to the alignment layer. The cylindrical rods are made of a semiconductor or solar material. In this embodiment, cylindrical rods are made of monocrystalline silicon. FIG. 6 shows four cylindrical rods 600 connected to alignment layer 300, though other numbers of rods may be used. In this embodiment, each cylindrical rod 600 is substantially cylindrical with a diameter of approximately 300 mm and a height of approximately 312 mm or approximately 468 mm. In other embodiments, cylindrical rods 600 may have any suitable dimensions. For example, in some embodiments, each cylindrical rod has a diameter greater than 220 mm.

Figure 7:
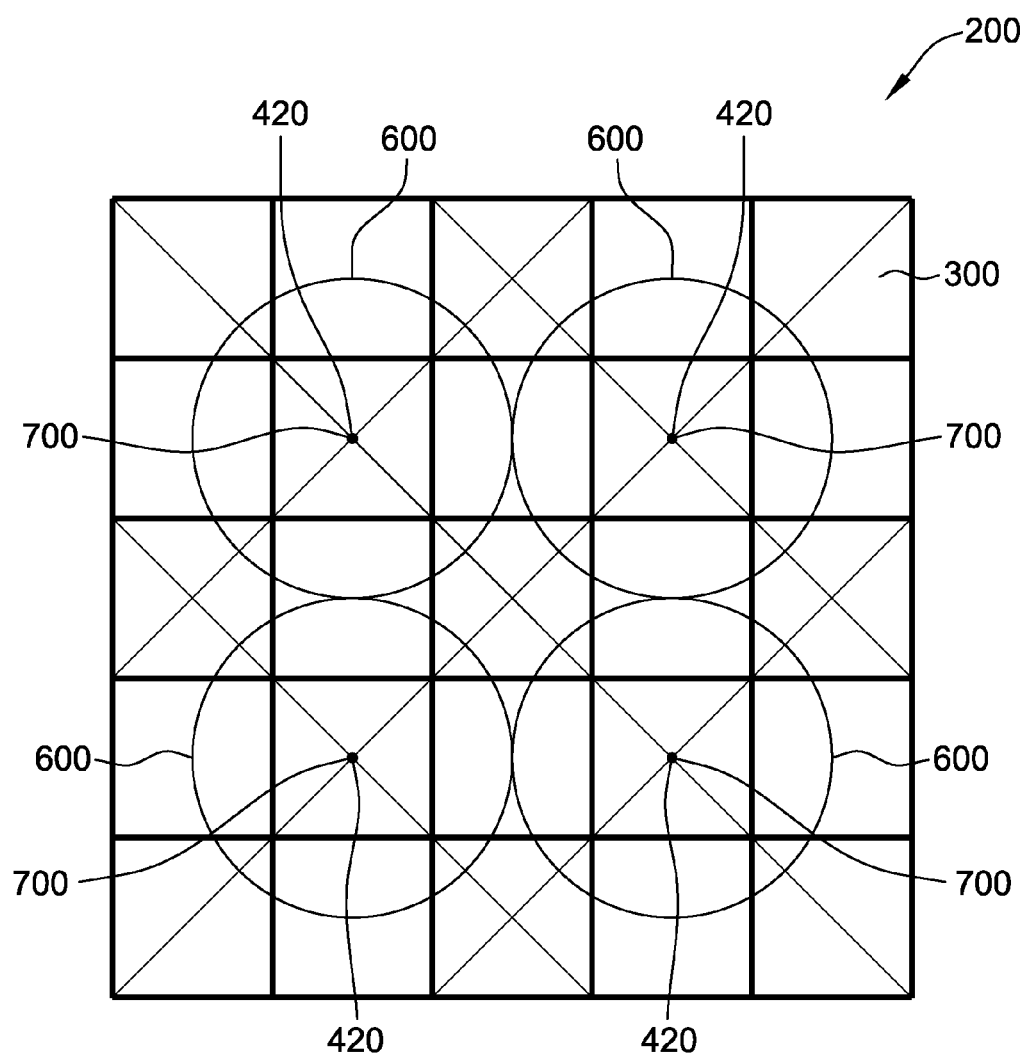
FIG. 7 is a schematic diagram of the apparatus shown in FIG. 6.

As shown in FIG. 7, cylindrical rods 600 are connected to alignment layer 300 such that a center 700 of each cylindrical rod 600 is aligned with a respective node 420, and zero dislocation ("ZD") lines of each cylindrical rod 600 are aligned with diagonal alignment lines 408. In this embodiment, where template 202 is a 5×5 template, four cylindrical rods 600 are connected to alignment layer 300. In other embodiments, a different number of cylindrical rods 600 may be connected to alignment layer 300, depending on the size of template 202. For example, in an embodiment using an 8×8 template 202, up to sixteen cylindrical rods 600 may be connected to alignment layer 300.

Figure 8:
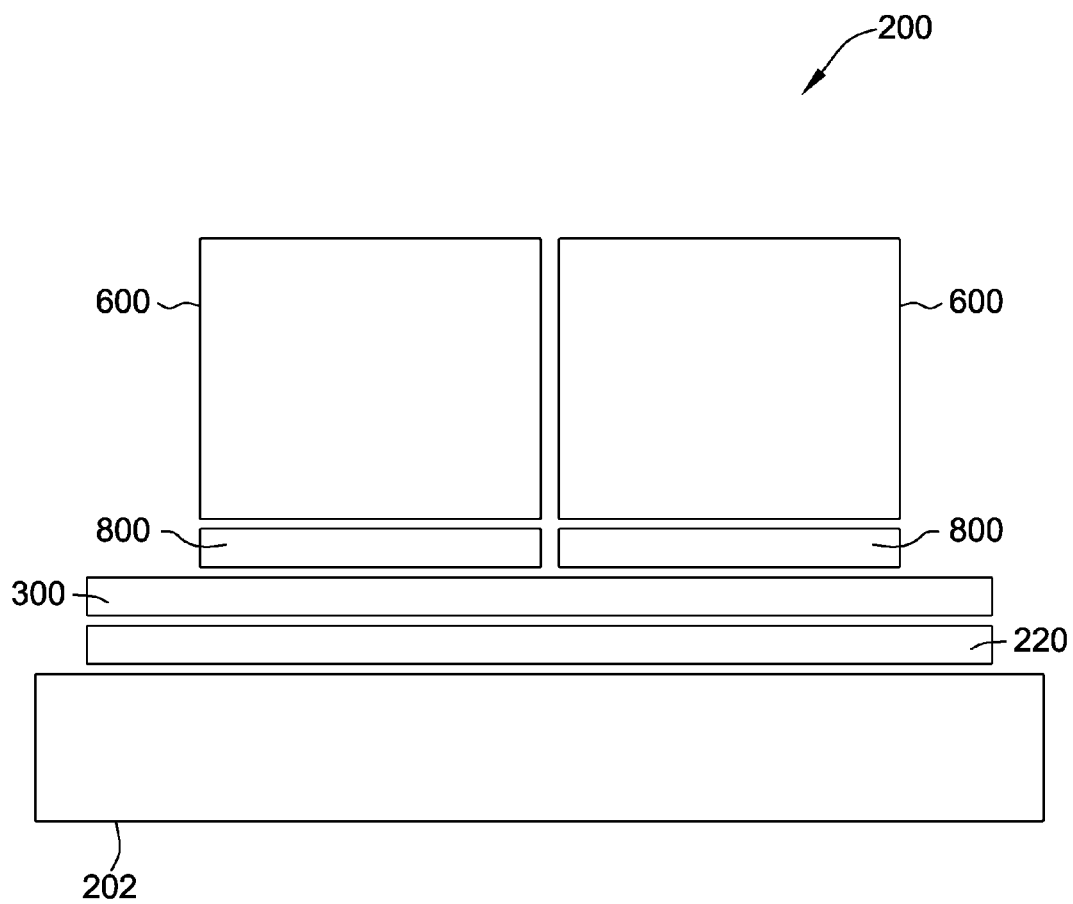
FIG. 8 is a schematic diagram of the apparatus shown in FIG. 6.

As shown in FIG. 8, in this embodiment, each cylindrical rod 600 is connected to alignment layer 300 using double-sided mounting tape 800. More specifically, double-sided mounting tape 800 is a circular piece of tape with approximately the same diameter as cylindrical rod 600.

In this embodiment, the following process is performed to connect each cylindrical rod 600 to alignment layer 300. First, cylindrical rod 600 is placed onto alignment layer 300 without using double-sided mounting tape 800. Cylindrical rod 600 is positioned until the center 700 of cylindrical rod 600 is aligned with an associated node 420. Once cylindrical rod 600 is aligned, at least one or more alignment marks are made on a side of cylindrical rod 600 that corresponds to a crystal 1-1-0 direction. This mark may be a semi-notch, ZD growth line, or other mark that is in the crystal 1-1-0 direction. For example, one or more alignment marks may be drawn on the side of cylindrical rod 600 where diagonal alignment lines 408 intersect cylindrical rod 600. One or more alignment marks may also be drawn on alignment layer 300. Also, other crystal directions may be used in other embodiments.

Cylindrical rod 600 is then removed from alignment layer 300. In this embodiment, double-sided mounting tape 800 includes opposing adhesive surfaces that are each covered by a removable non-stick protective film. One non-stick protective film is peeled away to expose one of the two adhesive surfaces, and double-sided mounting tape 800 is adhered to cylindrical rod 600 using the exposed adhesive surface. Cylindrical rod 600 is again placed onto alignment layer 300, with the adhesive surface facing alignment layer 300 still covered by a non-stick protective film. Using the at least one previously drawn alignment mark, cylindrical rod 600 is again aligned with the associated node 420.

Once aligned, an outline of cylindrical rod 600 (i.e., a circle in this embodiment) is drawn on alignment layer 300. Cylindrical rod 600 is then tilted to expose double-sided mounting tape 800. The remaining non-stick protective film is peeled away to expose the second adhesive surface, and cylindrical rod 600 is carefully lowered back into place such that rod 600 aligns with the drawn outline, ensuring that center 700 is substantially aligned with the associated node 420. This process is repeated to connect each cylindrical rod 600 to alignment layer 300.

As shown in FIG. 8, prior to slicing cylindrical rods 600, apparatus 200 includes alignment layer 300 connected to template 202 using adhesive layer 220. In addition, cylindrical rods 600 are connected to alignment layer 300 using pieces of double-sided mounting tape 800.

Referring back to FIG. 1, the cylindrical rods are sliced in step 110 to produce a plurality of rectangular seed bricks. In this embodiment, cylindrical rods 600 are sliced by a multi-wire web (not shown) that is lowered onto apparatus 200. Specifically, multi-wire web includes a plurality of vertical cutting wires that are aligned with vertical slots 206 in template 202 and a plurality of horizontal cutting wires that are aligned with horizontal slots 208 in template 202. Vertical and horizontal cutting wires may be, for example, wires impregnated with diamond dust to facilitate slicing cylindrical rods 600.

Figure 9:
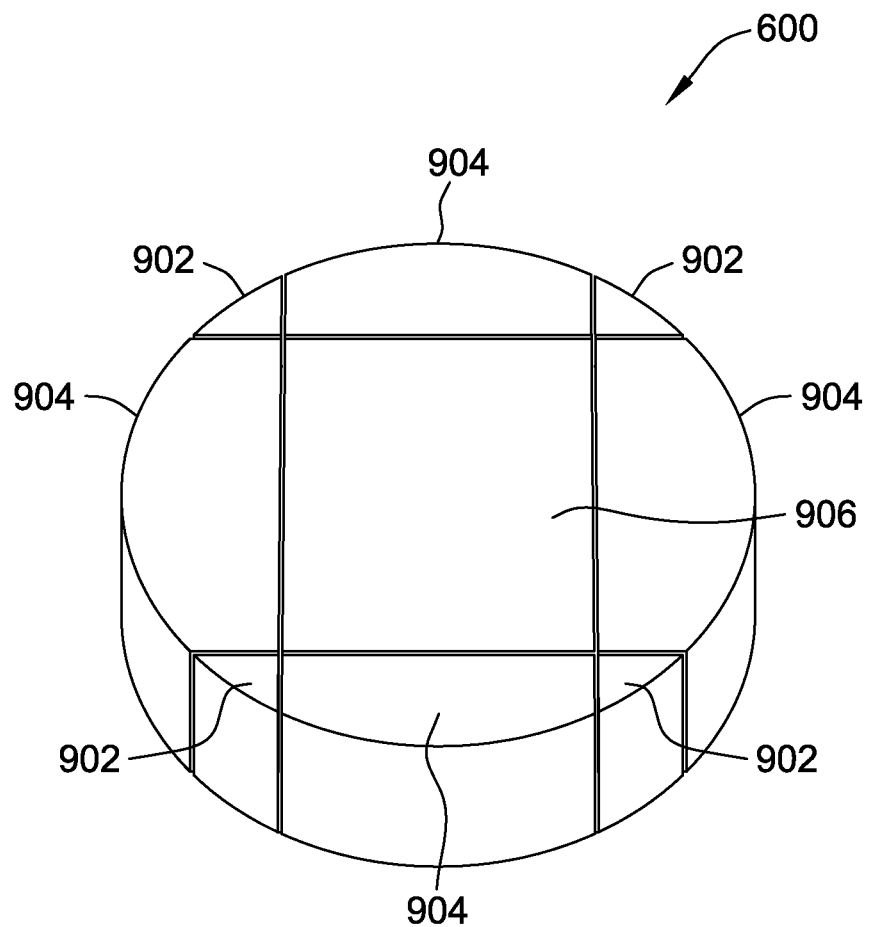
FIG. 9 is a perspective view of a sliced cylindrical rod produced using the apparatus shown in FIG. 6.

In this embodiment, multi-wire web is lowered until vertical and horizontal cutting wires cut through alignment layer 300, such that multi-wire web passes all the way through cylindrical rods 600. As multi-wire web is lowered, the vertical and horizontal cutting wires pass through and slice 110 cylindrical rods 600. FIG. 9 shows a cylindrical rod 600 after slicing 110.

As shown in FIG. 9, cylindrical rod 600 is sliced 110 into nine separate pieces: four corner portions 902, four quarter sections 904, and one rectangular seed brick 906. In this embodiment, each rectangular seed brick 906 has a cross-section of approximately 156 mm by 156 mm (roughly corresponding to dimensions of square-shaped sections 210) and a height of approximately 200 mm. In other embodiments, rectangular seed bricks 906 may have any suitable dimensions.

Figure 10:
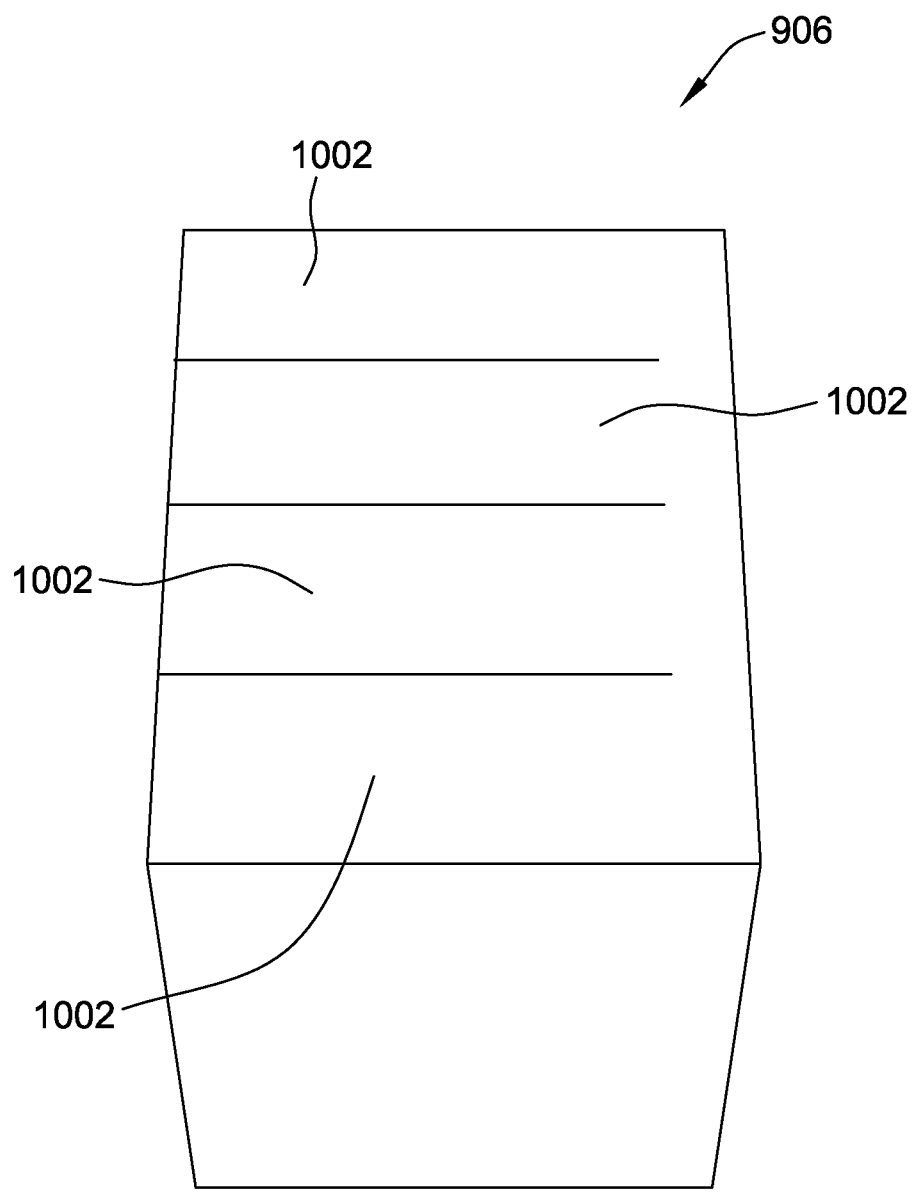
FIG. 10 is a perspective view of a seed brick taken from the sliced cylindrical rod shown in FIG. 9.

Each rectangular seed brick 906 can be marked and cropped into individual seeds 1002, as shown in FIG. 10. For example, in this embodiment, seed brick 906 is marked to be divided into four substantially identical seeds 1002.

In this embodiment, seeds 1002 are each used as a seed crystal in a directional solidification system (DSS) furnace to generate an ingot with a mono-like structure (i.e., a substantially mono-crystalline structure). Quarter sections 904 and corner portions 902 may also be cropped for use as seed crystals in a DSS furnace, as described herein. Semi-conductor wafers and/or high-efficiency solar wafers may be produced from the mono-like ingot generated in the DSS furnace.

Figure 11:
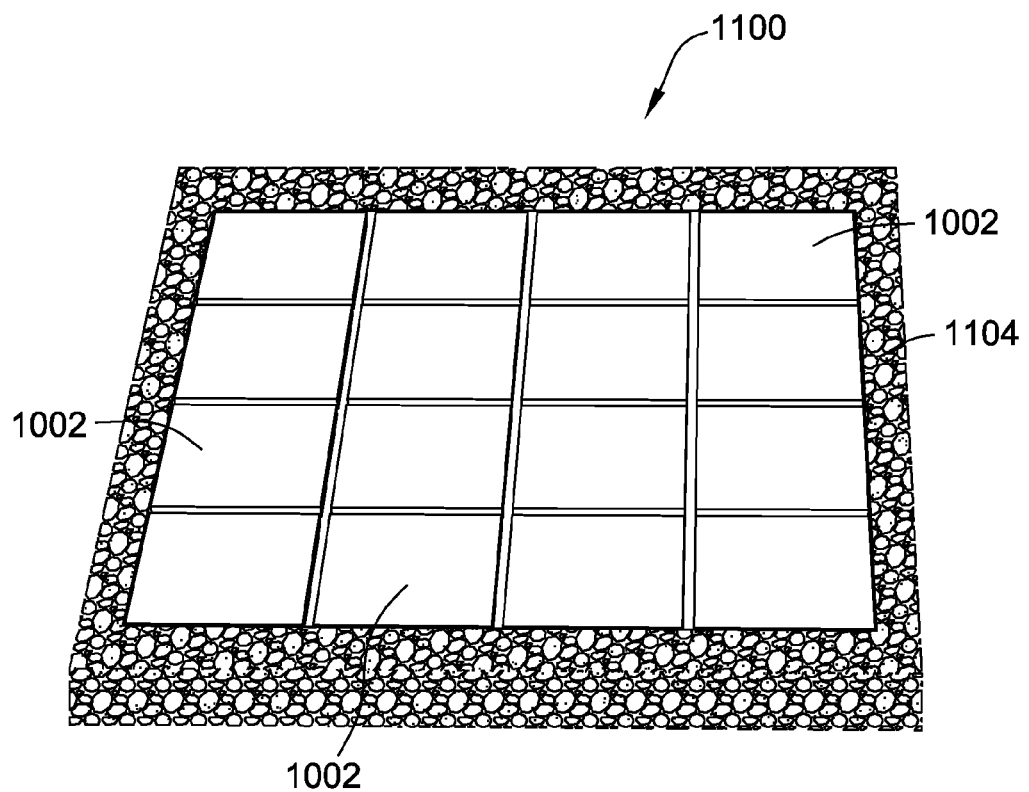
FIG. 11 is a perspective view of a pre-melt arrangement including seeds produced using the method shown in FIG. 1.

FIG. 11 shows a pre-melt arrangement 1100 including a plurality of seeds 1002 arranged in a grid. Arrangement 1100 is created in a crucible of, for example, a DSS furnace (neither shown). In arrangement 1100, seeds 1002 are surrounded by filler material 1104. In this embodiment, filler material 1104 is chipped and/or granular polysilicon. To form mono-like silicon ingots, the crucible is heated to melt seeds 1002 and filler material 1104. Seeds 1002 may also be covered with additional filler material 1104 prior to being melted.

Figure 12:
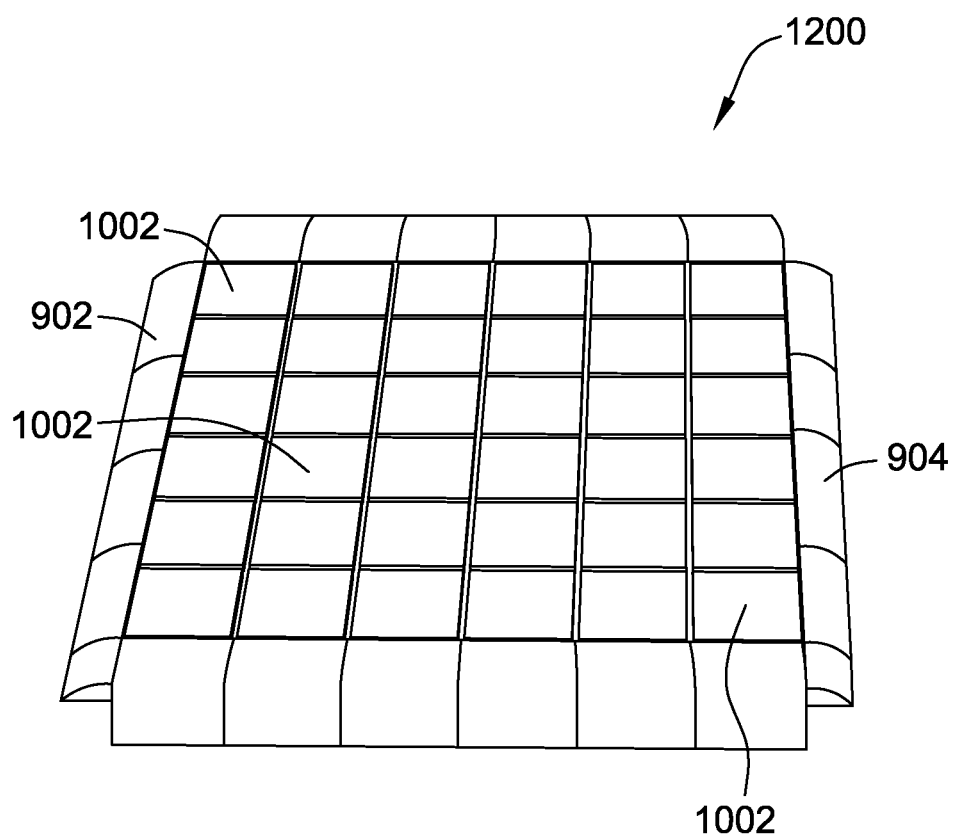
FIG. 12 is a perspective view of an alternative pre-melt arrangement including seeds produced using the method shown in FIG. 1.

FIG. 12 shows an alternative pre-melt arrangement 1200. Similar to arrangement 1100, arrangement 1200 includes a plurality of seeds 1002 arranged in a grid in a crucible (not shown). Instead of filler material 1104 (shown in FIG. 11), seeds 1002 are surrounded by a plurality of corner portions 902 and/or quarter sections 904 in arrangement 1200. Entire (i.e., whole) corner portions 902 and quarter sections 904 and/or smaller cropped segments of corner portions 902 and quarter sections 904 may be used to surround seeds 1002.

Using corner portions 902 and/or quarter sections 904 (and/or its cropped half-wings) in arrangement 1200 instead of filler material 1104 improves mono coverage of the ingot. Specifically, because corner portions 902 and quarter sections 904 (and/or its cropped half-wings) are monocrystalline silicon, corner portions 902 and quarter sections 904 (and/or its cropped half-wings) provide more material for producing mono-like silicon ingots than the polysilicon filler material 1104 of arrangement 1100. Arrangement 1200 may also be covered with filler material 1104 prior to being melted.

Figure 13:
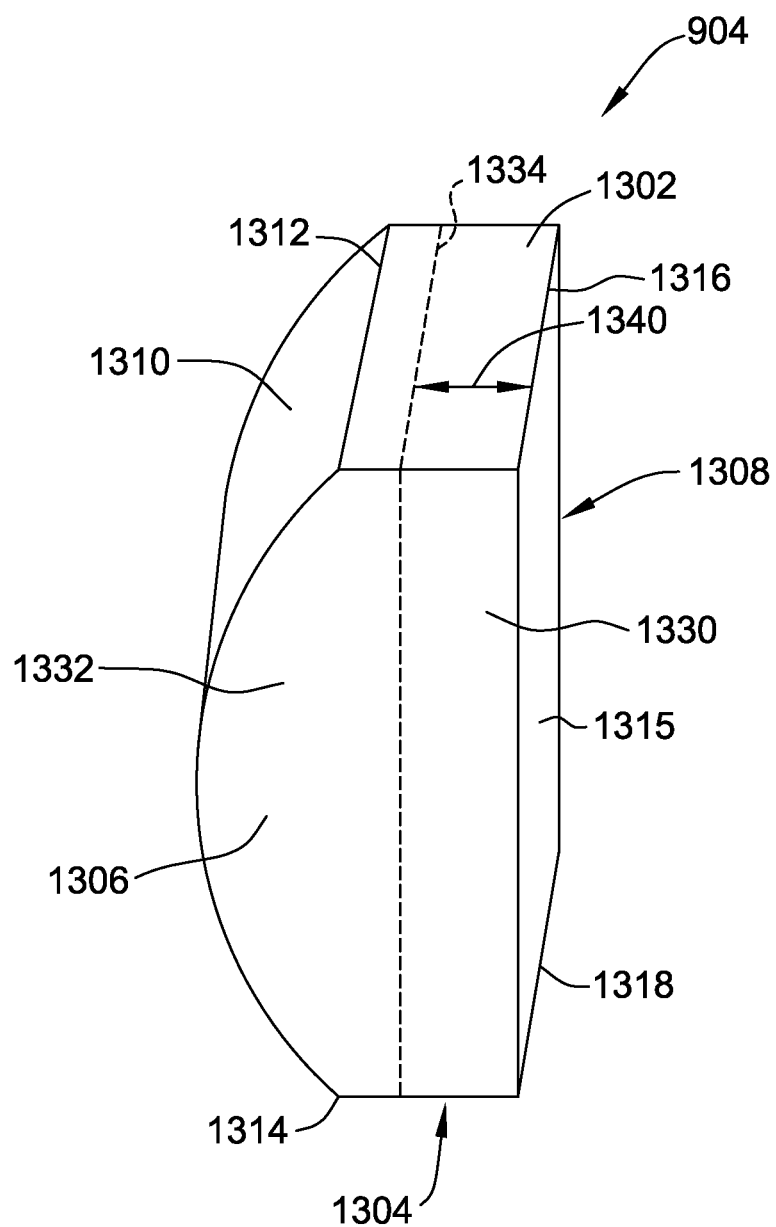
FIG. 13 is a perspective view of a quarter section.

FIG. 13 shows a quarter section 904 that may be produced, for example, by slicing through cylindrical rod 600. Quarter section 904 includes a first planar surface 1302, a second planar surface 1304 opposite first planar surface 1302, a first side surface 1306, and a second side surface 1308 opposite first side surface 1306. An arcuate surface 1310 extends from a first edge 1312 of first planar surface 1302 to a first edge 1314 of second planar surface 1304. A planar end surface 1315 extends from a second edge 1316 of first planar surface 1302 to a second edge 1318 of second planar surface 1304.

As shown in FIG. 13, quarter section 904 includes a rectangular seed portion 1330 and a curved wing portion 1332. Seed portion 1330 and curved wing portion 1332 are joined at an interface 1334 that defines a slicing plane oriented substantially parallel to planar end surface 1315 and oriented substantially orthogonal to planar surfaces 1302 and 1304. To produce rectangular seeds 1002, quarter section 904 is sliced along the slicing plane using, for example, template 202. Interface 1334 is located a distance 1340 from planar end surface 1315. In this embodiment, distance 1340 is in a range of 30 to 40 mm. In other embodiments, distance 1340 may have any suitable dimensions and multiple rectangular seeds 1002 may be produced.

Figure 14:
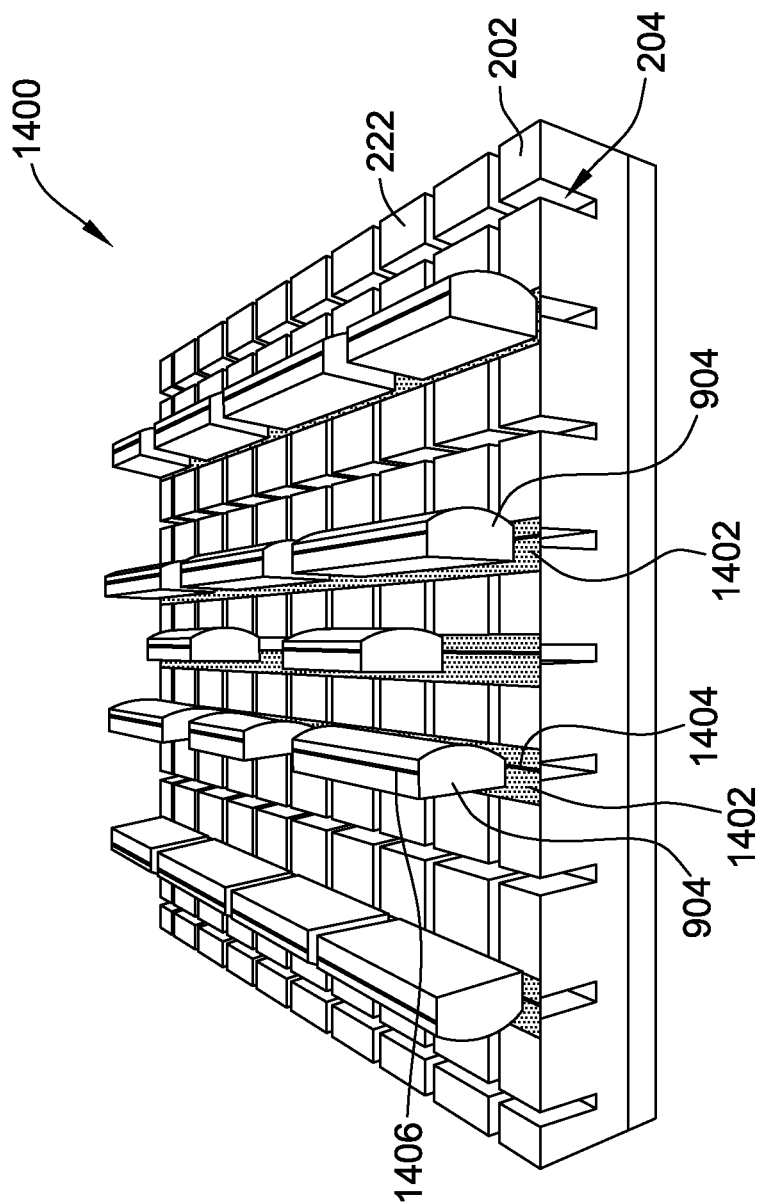
FIG. 14 is a perspective view of an apparatus for producing a seed from the quarter section shown in FIG. 13

FIG. 14 shows an apparatus 1400 for producing seeds 1002 from quarter sections 904. Apparatus 1400 includes template 202 having slots 204. As shown in FIG. 14, a plurality of quarter sections 904 are aligned along slots 204 (e.g., vertical slots 206 and/or horizontal slots 208).

To align quarter sections 904, an adhesive layer 1402 (e.g., pieces of double sided tape) is applied to top surface 222 of template 202 such that adhesive layer 1402 covers at least a portion of slots 204. A plurality of adhesive alignment lines 1404 are drawn on adhesive layer 1402. Adhesive alignment lines 1404 are substantially aligned with slots 204 covered by adhesive layer 1402.

Quarter section alignment lines 1406 are drawn on each quarter section 904. Specifically, in this embodiment, quarter section alignment lines 1406 are drawn on planar surface 1302 where interface 1334 intersects planar surface 1302, and on planar surface 1304 where interface 1334 intersects planar surface 1304. Quarter sections 904 are placed on adhesive layer 1402 such that quarter section alignment lines 1406 are aligned with the adhesive alignment lines 1404. Accordingly, for each quarter section 904, interface 1334 is aligned with a corresponding slot 402. Adhesive layer 1402 facilitates securing a position of quarter sections 904 during slicing.

To produce seeds 1002 from quarter sections 904, the multi-wire web (not shown) is lowered onto apparatus 1400. Cutting wires (e.g., vertical wires and/or horizontal wires) in the multi-wire web slice along interfaces 1334 of each quarter section 904 to separate seed portions 1330 from curved wing portions 1332. The sliced seed portions 1330 are rectangular seeds 1002. To further control dimensions of seeds 1002, the quarter sections 904 may be also sliced by wires in the multi-wire web that are substantially orthogonal to interfaces 1334. Seeds 1002 produced from quarter sections 904 may be used in, for example, arrangement 1100 and/or arrangement 1200.

Figure 15:
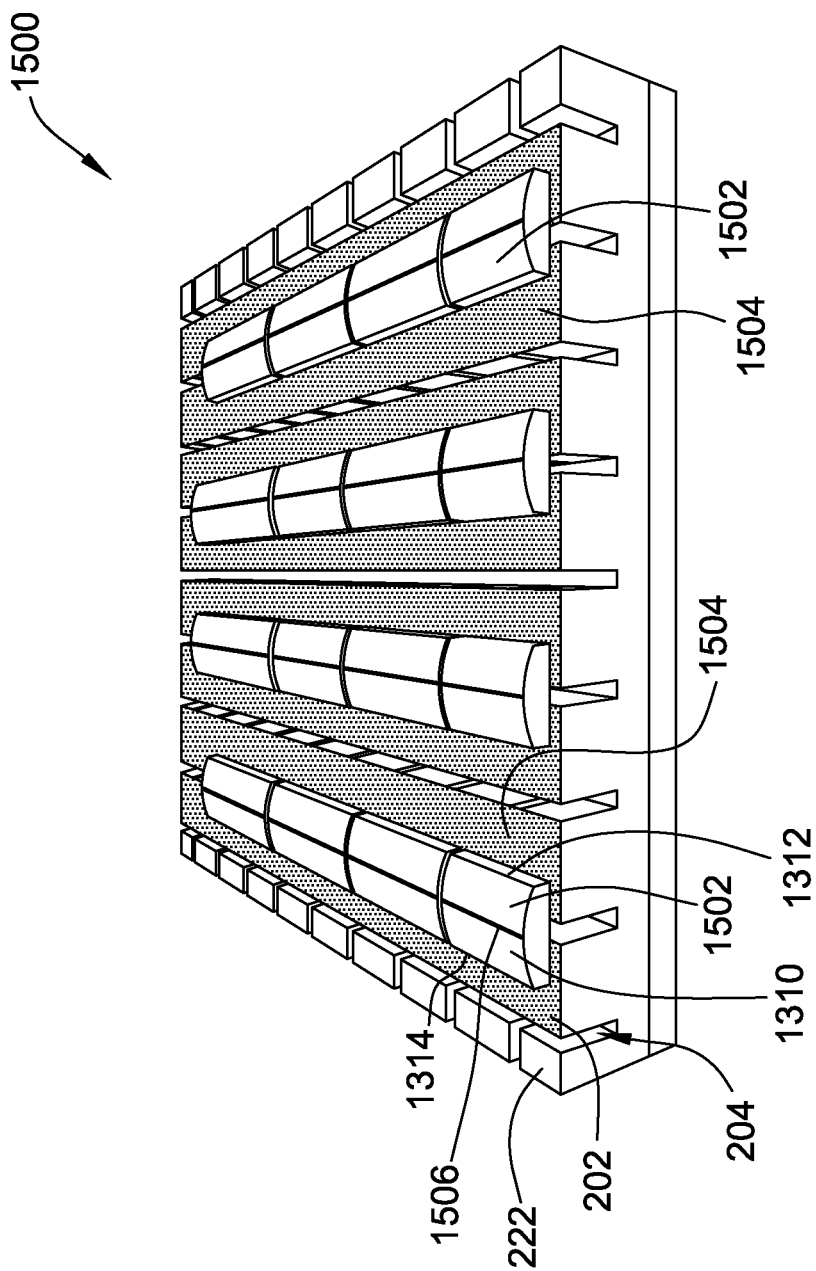
FIG. 15 is a perspective view of an apparatus for producing cropped segments of the quarter section shown in FIG. 13.

FIG. 15 shows an apparatus 1500 for producing the cropped segments of quarter sections 904 used in arrangement 1200 (shown in FIG. 12). Apparatus 1500 includes template 202 having slots 204. As shown in FIG. 15, a plurality of curved side wings 1502 are aligned along slots 204 (e.g., vertical slots 206 and/or horizontal slots 208). Curved side wings 1502 are curved wing portions 1332 separated from seed portions 1330 using, for example, apparatus 1400.

To align curved side wings 1502, an adhesive layer 1504 (e.g., pieces of double sided tape) is applied to top surface 222 of template 202. A curved side wing alignment line 1506 is drawn on each curved side wing 1502. Specifically, in this embodiment, for each curved side wing 1502, a curved side wing alignment line 1506 is drawn on arcuate surface 1310 substantially equidistant between first planar surface first edge 1312 and second planar surface first edge 1314. The curved side wings 1502 are placed on adhesive layer 1504 such that curved side wing alignment lines 1506 are aligned with slots 204. Adhesive layer 1504 facilitates securing a position of curved side wings 1502 during slicing.

To slice curved side wings 1502, the multi-wire web (not shown) is lowered onto apparatus 1500. Cutting wires (e.g., vertical wires and/or horizontal wires) in the multi-wire web slice through curved side wings 1502 at alignment lines 1506 to bisect each curved side wing 1502 into two half wings. To further control dimensions of half wings, the curved side wings 1502 may be also sliced by wires in the multi-wire web that are substantially orthogonal to alignment lines 1506. As explained above, the half wings produced using apparatus 1500 may be used in arrangement 1200.

In one embodiment, the slicing operation described in reference to FIG. 14 and the slicing operation described in reference to FIG. 15 may be performed simultaneously on a single template 202. That is, the multi-wire web may simultaneously slice through quarter sections 904 and curved side wings 1502 arranged on template 202.

Using slicing operations substantially similar to those specifically described herein, pieces other than quarter sections 904 that result from slicing cylindrical rods (e.g., rods 600) may be used to generate material for a DSS furnace. For example, at least one cylindrical rod having a diameter in a range of 195-210 mm may be squared to produce four side wings and a rectangular or pseudo-rectangular brick similar to seed brick 906. The side wings can be bisected using methods substantially similar to those described in reference to FIG. 15, resulting in half side wings that may be used to surround seeds 1002 in arrangement 1200.

Embodiments of the methods and systems described herein achieve superior results compared to prior methods and systems. For example, unlike at least some known seed brick production methods, the methods described herein produce a plurality of seed bricks significantly more quickly by simultaneously slicing a plurality of cylindrical rods. Further, unlike at least some known seed brick production methods that utilize band saws, the methods described herein utilize a multi-wire web and associated template, resulting in a uniform surface finish with parallel and square mating surfaces of the produced seed bricks, and reducing kerf loss. Moreover, the rectangular seed bricks, quarter sections, and corner portions produced using the methods described herein may be used as seeds in a crucible of a DSS furnace to produce mono-like silicon ingots. For example, the quarter sections may be sliced using the template and multi-wire web to produce curved side wings and additional rectangular seeds. Generally, the embodiments described enable producing seed bricks easier, faster, and/or less expensively than prior systems.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements.

As various changes could be made in the above without departing from the scope of the invention, it is intended that all matter contained in the above description and shown in the accompanying drawings shall be interpreted as illustrative and not in a limiting sense.

What is claimed is:

1. A method of producing rectangular seeds for use in semiconductor or solar material manufacturing, the method comprising:
    connecting an adhesive layer to a top surface of a template, the template including a plurality of parallel slots;
    drawing alignment lines on the adhesive layer, the alignment lines aligned with at least some of the parallel slots;
    connecting quarter sections to the adhesive layer such that an interface between a rectangular seed portion and a curved wing portion of each quarter section is aligned with at least one of the alignment lines drawn on the adhesive layer; and
    slicing each of the quarter sections with a wire web to separate the rectangular seed portions from the curved wing portions, wherein the sliced rectangular seed portions are rectangular seeds.

2. The method of claim 1, wherein connecting an adhesive layer includes connecting double-sided adhesive film to the top surface of the template.

3. The method of claim 1, further comprising arranging the rectangular seeds in a directional solidification system (DSS) furnace.

4. The method of claim 3, wherein arranging the rectangular seeds in the DSS furnace includes arranging the rectangular seeds in a grid.

5. The method of claim 1, further comprising:
    positioning the sliced curved wing portions on the template; and
    bisecting each of the sliced curved wing portions into two half wings using the wire web.

6. The method of claim 5, further comprising arranging the rectangular seeds and the half wings in a directional solidification system (DSS) furnace.

7. The method of claim 6, wherein arranging the rectangular seeds and the half wings in the DSS furnace includes:
    arranging the rectangular seeds in a grid; and
    surrounding the arranged rectangular seeds with the half wings.

8. The method of claim 1, wherein connecting the adhesive layer to the top surface of the template comprises connecting the adhesive layer to the top surface of a template including a grid of parallel horizontal slots perpendicular to parallel vertical slots.

* * * * *